United States Patent [19]

Lin et al.

[11] Patent Number: 4,746,929

[45] Date of Patent: May 24, 1988

[54] TRAVELING WAVE DROPLET GENERATOR FOR AN INK JET PRINTER

[75] Inventors: Larry W. Lin, Cupertino, Calif.; Joel W. Grover, Pittsford; Eugene Behun, Rochester, both of N.Y.

[73] Assignee: Xerox Corporation, Stamford, Conn.

[21] Appl. No.: 4,017

[22] Filed: Jan. 16, 1987

[51] Int. Cl.[4] ....................... G01D 15/18; H01L 41/08

[52] U.S. Cl. ................................ 346/75; 346/140 R; 310/321; 310/326; 310/356; 310/369

[58] Field of Search ............. 346/75, 140 R; 310/311, 310/321, 326, 356, 369

[56] References Cited

U.S. PATENT DOCUMENTS

| | | | |
|---|---|---|---|
| 3,683,212 | 8/1972 | Zoltan | 310/8.3 |
| 3,739,393 | 6/1973 | Lyon et al. | 346/1 |
| 4,303,927 | 12/1981 | Tsao | 346/75 |
| 4,354,129 | 10/1982 | Ieki | 310/313 C |
| 4,523,202 | 6/1985 | Gamblin | 346/75 |
| 4,554,558 | 11/1985 | Beaudet et al. | 346/75 |

*Primary Examiner*—E. A. Goldberg
*Assistant Examiner*—Gerald E. Preston
*Attorney, Agent, or Firm*—Robert A. Chittum

[57] ABSTRACT

A traveling wave droplet generator for a continuous stream ink jet printer comprising an ink filled tube connected in the vicinity of one end to an ink reservoir. A piezoelectric driver assembly is mounted at the fill end of the tube. The tube has openings connecting to orifices of an aperture plate bonded thereto. The tube has a terminator at the end opposite to the piezoelectric driver to suppress reflection and standing wave formation. The ink streams emitted through the nozzles of the aperture plate are stimulated by the traveling wave causing the streams to break up at predetermined distances from the nozzles.

6 Claims, 3 Drawing Sheets

TRAVELING WAVE DROPLET GENERATOR FOR AN INK JET PRINTER

BACKGROUND OF THE INVENTION

1. Field of the Invention

This invention relates to printheads for continuous stream-type ink jet printers and more particularly to such printheads having an elongated droplet generator from which a plurality of equally spaced ink streams are emitted, the ink streams being stimulated by traveling sound wave generated at one end of the droplet generator.

2. Description of the Prior Art

Ink jet devices of the continuous stream type generally employ a printhead having a droplet generator with multiple nozzles from which continuous streams of ink droplets are emitted and directed to a recording medium or a collecting gutter. The ink is stimulated prior to or during its exiting from the nozzles so that the stream breaks up into a series of uniform droplets at a predetermined distance from the nozzles. As the droplets are formed, they are selectively charged by the application of a charging voltage by electrodes positioned adjacent the streams at the location where they break up into droplets. The droplets which are charged are deflected by an electric field either into a gutter for ink collection and reuse or to a specific location on the recording medium, such as paper, which may be continuously transported at a relatively high speed across the paths of the droplets.

Printing information is transferred to the droplets through charging by the electrodes. The charging control voltages are applied to the charging electrodes at the same frequency as that which the droplets are generated. This permits each droplet to be individually charged so that it may be positioned at a distinct location different from all other droplets or sent to the gutter. Printing information cannot be transferred to the droplets properly unless each charging electrode is activated in phase with the droplet formation at the associated ink stream. As the droplets proceed in flight towards the recording medium, they are passed through an electric field which deflects each individually charged droplet in accordance with its charge magnitude to specific pixel locations on the recording medium.

A common method of perturbating an array of continuous ink streams is by a piezoelectric driver which produces acoustic waves which traverse an ink reservoir to the nozzles, perturbating the ink streams and ideally causing uniform breakup of the streams in terms of break off length. Thus, the drop generator reservoir to manifold has two functions, to distribute ink to the individual nozzles and to distribute acoustic energy to the individual streams to cause a controlled uniform breakup into droplets.

Since the reservoir is an acoustic pathway to the ink streams, it must be acoustically designed. This means the materials used should be acoustically matched to the ink and the fabrication must be of high precision. The completed droplet generator must have a piezoelectric driver accurately positioned in a precision reservoir confronting a precise array of nozzles. The droplet generators successfully meeting the design criteria tend to be quite bulky and heavy and costly to fabricate. Further, the design of a long array, multiple stream droplet generator usually presents a formidable problem in achieving uniform stimulation of the stream breakup because of standing wave formation. Non-uniform stimulation in a long array creates many disadvantages and difficulties in ink jet printing. For example, the jets will break up in a wide range of break off lengths, necessitating a very long charge tunnel. Also non-uniform stimulation will cause the ink streams to break up in different satellite conditions that complicates the charging mechanism. All liquid jet streams which are stimulated with low acoustic power normally break up into a series of uniform, large drops separated by much smaller drops called satellites. The satellite droplet separates first from the jet stream in front of the main droplet, which then separates next. Later, the satellite merges backward into the main drop. This is called the rear merge condition. Because the two droplets are formed at different times, they may be exposed to the same or different charging voltages depending on the charging phase relationship to the droplet break off phase. In both cases, the droplets can be charged and deflected to their targets accurately. However, a typical charging phase window for a rear merge condition is about 200 degrees, which is marginal for a practaical ink jet printer. Depending on the power level of stimulation, the large drops and accompanying satellites fall into various categories of rear merging satellite, forward merging satellite, and no satellite. In the cases of forward merge satillite and no satellite conditions, the charge phase window is about 300 degrees, which provides the necessary latitude for phase drift. Generally speaking, it is critical for all jet streams in a multiple jet printer to have the droplets break off in a forward merge or no satellite condition if high quality printing and a reliable printing system is to be achieved.

U.S. Pat. No. 3,683,212 to Zoltan discloses a pulse or on-demand droplet ejecting system having a tubular piezoelectric member through which the liquid ink flows in route to the nozzle through which the droplets are ejected. An electrical pulse applied to the transducer creates an acoustical pressure pulse caused by the periodic constricting of the piezoelectric member. Each constriction ejects a droplet.

U.S. Pat. No. 3,739,393 to Lyon et al discloses a traveling wave drop generator wherein one end of the nozzle plate is vibrated to propagate the traveling wave. This causes a continuing series of bending waves to travel the length of the nozzle plate. Ink stream stimulation by prior art methods are illustrated in FIG. 5A of the patent to Lyon et al, while the stimulation in accordance with the Lyons et al invention is shown in FIG. 5B. The prior art ink stream broke off at varying distances from the nozzles necessitating an elongated charging electrode and the attendant printing quality impact as such elongated charging electrodes caused. In contrast to the prior art break off lengths in FIG. 5A, the stream stimulated in accordance with Lyon et al have a nearly uniform nominal stream length. The only significant variation being a slightly longer length of ink stream displaced along the plate in the direction of the bending travel wave. This lengthening is the predictable result of bending wave attenuation during propagation and the relatively small printing errors associated therewith may be corrected by introducing fixed time delays in the charge circuits.

U.S. Pat. No. 4,554,558 to Beaudet et al discloses a fluid jet printhead comprising a plurality of piezoelectric means which when electrically excited produce pressure waves which travel through the ink. An acoustic isolation material made of a polyurethane foam surrounds the piezoelectric means. However, Beaudet et al does not use a traveling wave droplet generator.

U.S. Pat. No. 4,523,202 to Gamblin discloses the use of a random signal generator to drive an electroacoustic transducer that is coupled to the ink so as to reduce the adverse the printing effects otherwise caused by standing acoustic waves along the length of an orifice array. The Gamblin ink jet printer also does not use traveling wave drop generator.

SUMMARY OF THE INVENTION

It is an object of this invention to provide a traveling wave droplet generator for an ink jet printer which has a uniform break off length for each of its ink streams. The invention further provides a cost effective design having uniform stimulation and stable operation with a no satellite condition.

In the present invention, an improved traveling wave droplet generator is disclosed having a sound wave generated with a piezoelectric driver at one end of an ink filled tube. A series of passageways perpendicularly penetrate the tube wall to provide communication with nozzles in a nozzle plate aligned with the passageways and fixed to the tube. The piezoelectric driver comprises a piezoelectric transducer mounted on one side of a flexible member which acts as a diaphragm. Cylindrical pistons are coaxially aligned on opposite sides of the flexible member, one adjacent the flexible member and the other adjacent the piezoelectric transducer. The piezoelectric driver is mounted on one end of the traveling wave generator with its pistons coaxial with the axis of the ink filled tube. On the other end is an anechoic terminator also coaxially aligned with the traveling wave tube. The purpose of the anechoic terminator is to terminate a sound wave generated from the piezoelectric driver and reduce the standing wave in the tube. To enhance further the coupling of the sound wave to the anechoic terminator, the front end of the terminator can be tapered into a wedge shape. The traveling wave drop generator has an inlet through which pressurized ink is maintained in the traveling wave tube and a vent which may be used to flush or vent the traveling wave tube.

The foregoing features and other objects will become apparent from a reading of the following specification in connection with the drawings, wherein like parts have the same index numerals.

DESCRIPTION OF THE PREFERRED EMBODIMENT

Figure 1:
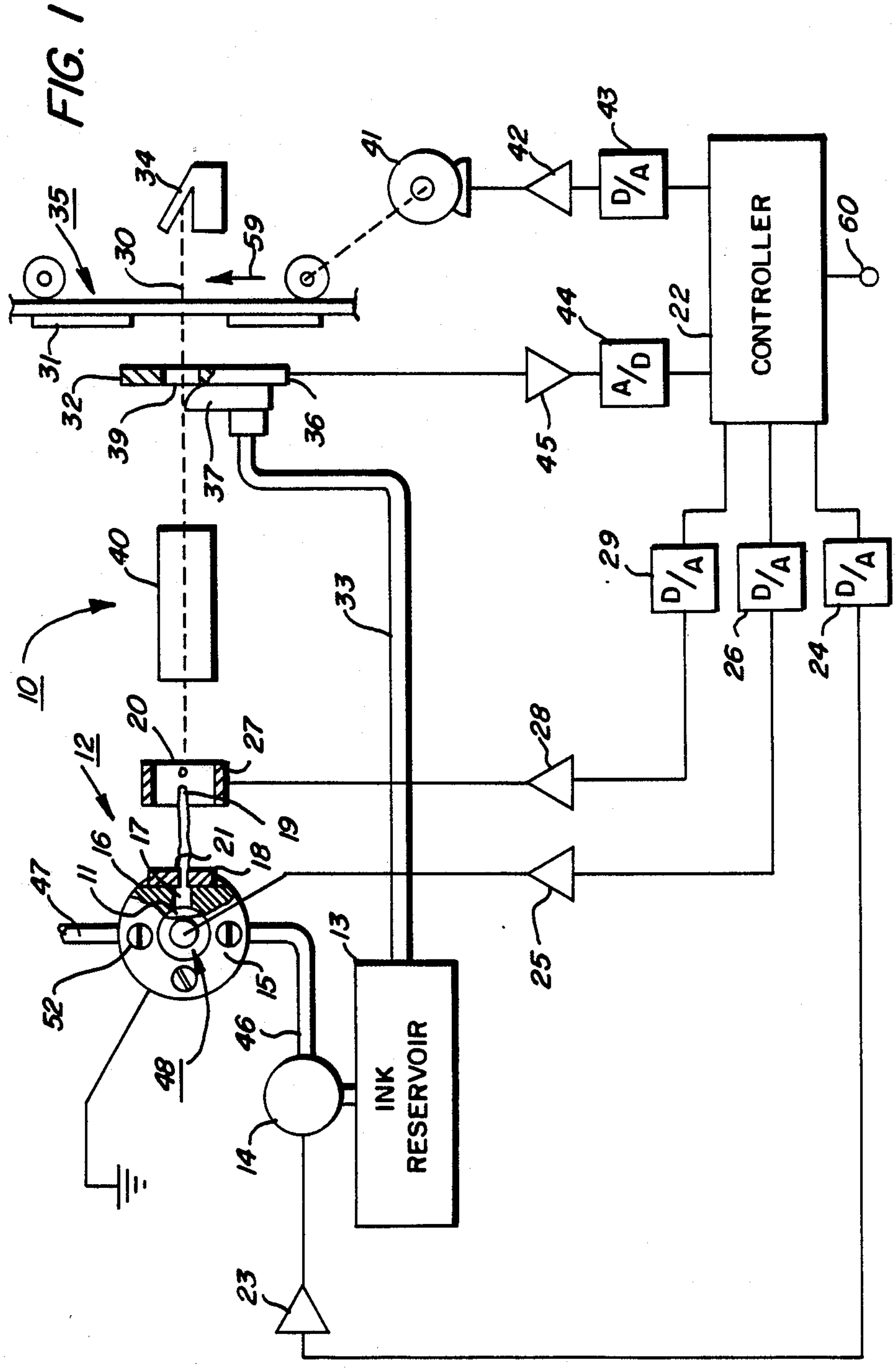
FIG. 1 is an elevation view in schematic form of a continuous stream type, pagewidth ink jet printer having a traveling wave drop generator that is the subject matter of the present invention.

Referring to FIG. 1, a continuous stream type ink jet printer 10 is depicted employing the traveling wave droplet generator 12 of the present invention. Fluid ink 11 is contained in reservoir 13 and is moved by pump 14 into the traveling wave tube 16 of the traveling wave droplet generator 12. The traveling wave tube serves as an ink manifold or reservoir. The traveling wave droplet generator has a nozzle plate 18 fixed to the traveling wave tube. Passageways 17 in the tube are aligned with the nozzles 21 of the nozzle plate. The passageways 17 are generally larger than the diameter of the nozzles 21 and provide a means of ink flow from the traveling wave tube 16 to the nozzles 21. As will be discussed in detail later with respect to FIGS. 2–4, the traveling wave droplet generator comprises an elongated tube with a plurality of passageways along its length aligned with nozzles 21 in a nozzle plate 18 fixed to the traveling wave tube. The ink is fed by pump 14 through supply line 46 to the traveling wave tube 16. Vent line 47 may be selectively opened for flushing the traveling wave tube and for venting any air or trapped gasses therefrom. The piezoelectric driver assembly, described later, is mounted on one end of the tube by mounting ring 15, the mounting ring sealingly sandwiches the flexible member 38 to the traveling wave tube by means such as bolts 50. The flexible member 38 acts as a diaphragm which seals the ink in the traveling wave tube. When the piezoelectric driver is operated, it moves about the flexible member which acts as a nodal plane for the piezoelectric driver.

Each nozzle emits a continuous stream of ink 19 and droplets 20 are formed from the stream at a finite distance from the nozzles due to stimulation of the ink by the piezoelectric driver. The pressure of the ink in the traveling wave tube 16 is controlled by pump 14 and establishes the velocity of the droplets 20. The pulsation introduced by the piezoelectric driver 48 establishes the rate of droplet generation. Both the velocity and the droplet frequency are under the control of a microcomputer or controller 22. Droplet velocity is controlled by regulating the pump to appropriately increase or decrease the ink pressure in the manifold 16. The controller communicates with the pump 14 via amplifier 23 and digital-to-analog (D/A) converter 24. The controller communicates with the piezoelectric driver by means of amplifier 25 and D/A converter 26. A charging electrode 27 for each nozzle is located at the position where the droplets 20 are formed from streams 19. The charge electrodes are also under the control of the controller 22. The charge electrodes 27 are coupled to the controller by means of an amplifier 28 and D/A converter 29. The function of the charging electrodes is to impart a negative, positive, or neutral charge to the droplets 20. The fluid ink is conductive and is electrically coupled to ground through the tube or manifold 16. When a voltage is applied to the electrode 27 by the controller at the instant of droplet formation, the droplet assumes a charge corresponding to the voltage applied to the electrode. In the embodiment illustrated in FIG. 1, uncharged droplets follow an undeflected flight path 30 to the recording medium 31. Charged droplets are deflected left and right of path 30 in a plane perpendicular to the surface of FIG. 1, depending on the sign of the charge. Predetermined values of positive and negative charge for a droplet 20 will cause it to follow a path that directs it into a gutter 37 located to the right or left of centerline paths 30. The ink collected in gutter 37 is returned to the reservoir 13 via conduit 33. Since FIG. 1 is a side view, only one passageway 17, nozzle 21, and ink stream 19 are seen in that Figure, but it should be understood that a series of nozzles extend along the traveling wave tube 16 to generate a series of parallel ink columns.

Droplets which are either uncharged or charged to a level insufficient to cause their trajectory to lead to gutter 37 are directed past a droplet sensor 32 to recording medium 31. The droplet sensor 32 is used to sense passage of ink droplets towards the recording medium and modify printer operation to insure that ink droplets from the plurality of ink streams are properly positioned on the recording medium. When a stitched system is utilized, as in the preferred embodiment, the droplet sensor 32 insures that the ink droplets are properly stitched together to allow each incremental region of the recording medium to be accessed by the droplets from one of the droplet generator nozzles. An example of the use and application of a typical droplet sensor 32 is disclosed in U.S. Pat. No. 4,255,754 to Crean et al, entitled "Fiber Optic Sensing Method and Apparatus for Ink Jet Recorders", which has been assigned to the assignee of the present invention.

A second gutter 34 for recirculating ink droplets is used to intercept droplets generated while calibrating the system with the aid of the droplet sensor 32. One application to which the present invention has particular applicability is a high speed ink jet device wherein successive sheets are recording medium or paper 31 are transmitted past the ink jet printhead 10 and encoded with information. Experience has indicated that it is desirable to recalibrate the printer at periodic intervals to insure that the droplets 20 are directed to desired regions on the recording medium 31. To accomplish this calibration, ink droplets are generated and caused to travel past the sensors 32 when no recording member 31 is in position to receive those droplets. In the calibration mode, it is therefore necessary that a gutter 34 be positioned to intercept droplets which pass between successive sheets of the recording medium. A transport mechanism 35 is also shown in FIG. 1. The transport 35 is used to move individual sheets of recording medium, such as paper 31, past the droplet streams 19 at a controlled rate of speed. Since the present printer is a high speed device, a mechanism must be included in the transport 35 for delivering paper to the transport and for stripping paper away from the transport once it has been encoded by the printer 10. These features of the transport have not been illustrated in FIG. 1, since it is not related to the traveling wave droplet generator 12 which is the subject of the present invention. The stitch sensors described in the Crean et al patent referred to above, are mounted on a sensor support board 36. The support board has an aperture 39 that permits the droplets 20 emitted by the nozzles to pass therethrough and either be collected by the gutter 34 during calibration or printed on the recording medium 31. A charged droplet is deflected due to the electrostatic field between deflection electrodes 40 associated with each nozzle. The deflection electrodes 40 have very high voltages coupled to them to create the deflection fields. The potential difference between the voltages is generally in the magnitude of 2,000 to 3,000 volts. The magnitude of the voltage applied to the charging electrode 27 is generally in the range of 10 to 200 volts.

Ink droplet generation, charging, and recording medium transport are all controlled by the controller 22 which interfaces with the various components of the printer 10 by digital-to-analog and analog-to-digital converters. The controller comprises an input 60 for receiving a sequence of digital signals representative of desired voltages to be applied to the charging electrodes 27. The controller then generates multi-bit digital signals representative of desired charging voltages. As stated above, digital-to-analog converter 29 converts the digital signals representative of the desired charging voltage to an analog signal which is coupled to a power amplifier 28, which in turn energizes the charging electrode 27.

In addition to generating the charging voltage for the plurality of charging electrodes 27, the controller 22 receives inputs from the droplet sensor 32 via an analog-to-digital converter 44, controls the speed of movement of the recording medium 31 via a second digital-to-analog converter 43 which drives motor 41 via amplifier 42, controls perturbation of the ink jet streams by the piezoelectric device 48 through a third digital-to-analog converter 26, and controls the pressure maintained inside the traveling wave tube 16 by pump 14 with a fourth digital-to-analog converter 24.

As disclosed in the U.S. Patent to Crean et al, sensor 32 uses a pair of photodetectors to sense ink droplets, one each for two output fibers that are used to generate an electric zero crossing signal. The zero crossing signal is used to indicate alignment or misalignment of a droplet relative to a bisector of a distance between the two output fibers. The sensor of this patent employs one input optical fiber with each two output optical fibers for each stitch point. The free ends of the fibers are spaced a small distance from each other; the free end of the input fiber is on one side of the flight path of the droplets and the free end of the output fibers are on the opposite side. The remote end of the input fibers is coupled to a light source (not shown), such as an infra-red light emitting diode. The remote ends of each output fiber are coupled to separate photodetectors (not shown), such as for example, a photodiode responsive to infra-red radiation. The photodiodes are coupled to differential amplifiers (not shown), so that the output of the amplifiers are measurements of the location of droplets relative to the bisector of the distance between the output fiber ends confronting their associated input fibers and droplets passing therebetween. The amplifier outputs are coupled to a comparator 45 which in turn is coupled to the controller 22 via analog-to-digital converter 44 and used in servo loops to position subsequently generated droplets to the bisector location. By using one of the zero crossing signal detectors at a location between adjacent endmost droplets thrown from the separate adjacent nozzles, the stitch point between these nozzles can be controlled so that the segments of each line of droplets to be printed by each nozzle may be adjusted to prevent gaps or overprinting on the recording medium 31.

Figure 2:
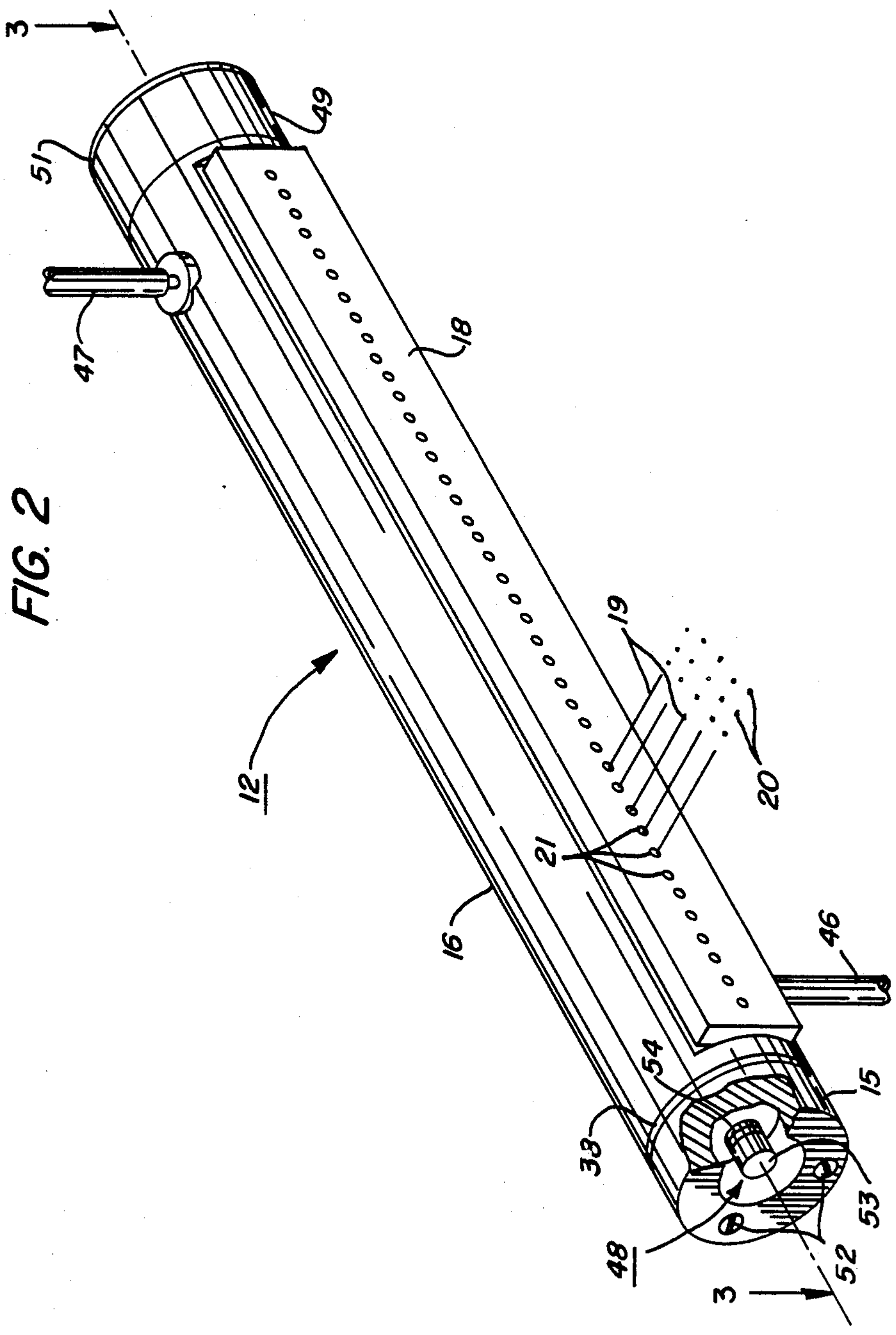
FIG. 2 is an isometric view of the traveling wave drop generator of FIG. 1.

In FIG. 2, an isometric view of the traveling wave droplet generator is shown with streams 19 of pressurized ink flowing through nozzles 21. An annular mounting ring 15 is removably attached to one end of the traveling wave tube 16 by means such as, for example, bolts 50. Sandwiched between the mounting ring 15 and the traveling wave tube 16 is the flexible member 38 of the piezoelectric driver assembly 48. An ink supply line 46 is in communication with the ink in the tube. Nozzle plate 18 is flat and is bonded to the traveling wave tube. A flat surface may be machined on the exterior surface of the traveling wave tube to better accommodate the flat nozzle. The nozzles 21 are in alignment with the traveling wave tube passageways 17, better shown in FIG. 3. Vent line 47 communicates with the ink in the traveling wave tube on an end opposite to the one with the supply line 46. Periodically, the vent line is selectively opened for purging of air that might be trapped therein. On the opposite end from the piezoelectric assembly, a mounting structure for holding the anechoic terminator 50 is removably attached to the traveling wave tube by means, for example, such as bolts 52 and end cap 51.

Figure 3:
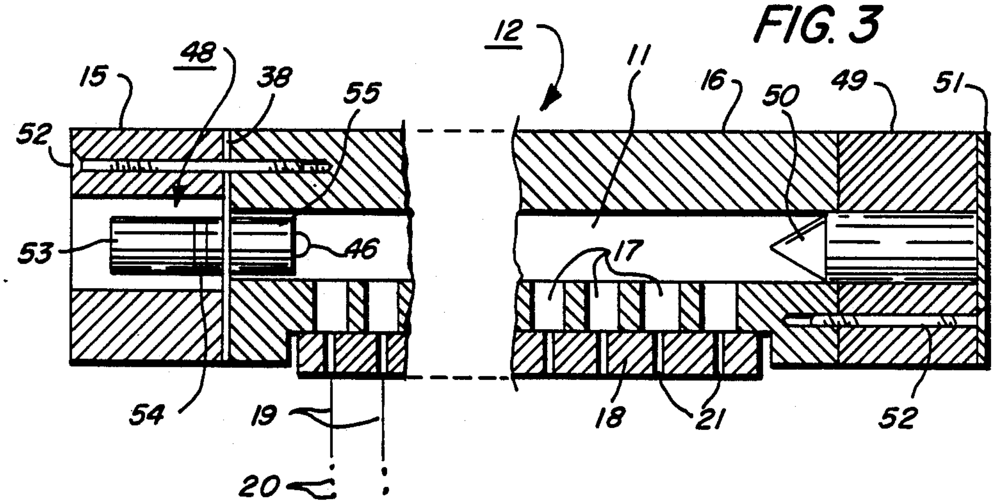
FIG. 3 is a cross-sectional view of the traveling wave generator shown in FIG. 2 as viewed along view line 3—3.

FIG. 3 is a cross-sectional view of the traveling wave droplet generator of FIG. 2 as viewed along view line 3—3 thereof. In the preferred embodiment, the traveling wave tube 16 consists of a smooth-bore stainless steel tube, the fabrication of which may be accomplished by the gun-drilling technique. The internal diameter of the tube should be as large as possible to ease fabrication, but not so large as to allow acoustic cross modes to propagate during operation of the piezoelectric driver assembly 48. In the preferred embodiment, the internal diameter of the tube 16 is about 0.2 inches or 0.5 cm for 144 KHz operation. This will insure plane wave propagation in the tube for uniform stimulation. Generally, a diameter less than 0.6 wavelength will insure this condition. The surface finish of the bore or internal diameter should be smooth enough to avoid excess attenuation of the propagating plane sound wave. The passageways 17 which provide communication between the nozzle 21 and the internal cavity or manifold 16*a* of the traveling wave tube are drilled across the length of the traveling wave tube, each passageway having a length of a multiple of half-wave length to minimize attenuation of the traveling acoustic wave. The purpose of the anechoic terminator 50 is to terminate a sound wave generated from the piezoelectric driver assembly. It is desired to keep the reflected wave, and thus the standing wave ratio in the traveling wave tube, to a minimum. The actual requirement will depend upon the wall losses and incremental orifice losses due to through flow. However, the goal is for the pressure wave intensity within the tube to be uniform to less than a factor of 4. Any rubber material with an acoustic impedance close to the ink and having a high absorption coefficient can be used for this purpose. To enhance further the coupling of the sound wave into the rubber, the front end 50*a* of the anechoic terminator is preferably tapered in a conical or wedge shape.

Alternatively, the anechoic terminator may be an impedance screen (not shown) positioned within the traveling wave tube about a quarter wavelength from the end of traveling wave tube that is opposite the end having the piezoelectric assembly. Another absorber approach (not shown) is to use a perforated plate instead of the wedge-shaped resilient terminator 50 which opens into a relatively large cavity, with or without a resistive absorbing wall in the large cavity.

Figure 4:
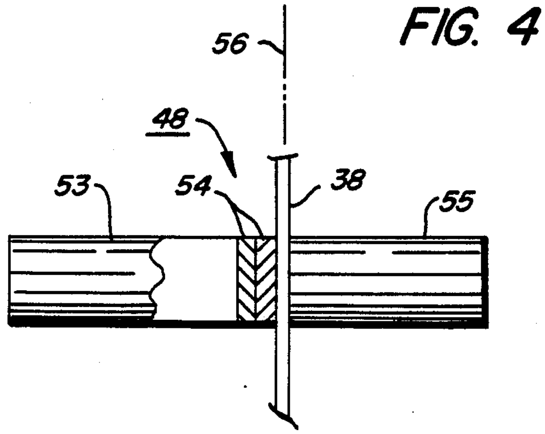
FIG. 4 is a side view of the piezoelectric driver.

In FIG. 4, the piezoelectric driver assembly 48 is shown. The preferred design of the piezoelectric driver assembly is a half wavelength steel resonator. A conventional sandwich-type design piezoelectric transducer 54 such as that available from the Clevite Corporation of Cleveland, Ohio is used. The conventional piezoelectric transducer is a metal PZT-PZT metal sandwich selected to resonate a a frequency higher than the given operating frequency of the traveling wave droplet generator. This will help insure driver phase stability. The midpoint of the driver is a node 56, suitable as a supporting point of the piezoelectric driver assembly. Flexible member 38 serves as the supporting structure with pistons 53 and 55 coaxially aligned on either side of the flexible member 38. Thus, one end of the driver 48 is air backed and the other end radiates into the ink filling the traveling wave tube 16.

In a pagewidth printing configuration, the traveling wave droplet generator 12 has at least one row of nozzles 21 which extend substantially across the width of the recording medium. The droplet generator is held stationary and the recording medium 31, see FIG. 1, is continually moved therepast during the printing operation. The row of nozzles are substantially perpendicular to the direction of movement of the recording medium, though other configurations are possible. Passageways 17 perpendicularly penetrate the traveling wave tube 16. These passageways are coaxially aligned with the nozzles 21 and have a larger internal diameter than the nozzles. In the preferred embodiment, each nozzle plate 18 has 116 nozzles with each nozzle having a diameter of about 25 microns and has a nozzle spacing of about 107 mils or 2.7 mm center to center. The internal diameter of the passageways 17 is around 20 to 40 mils or 0.5 to 1.0 mm.

Since the traveling wave droplet generator has a non-resonant cavity, tolerances can be considerably relaxed in comparison with that of the typical continuous stream ink jet droplet generator having a piezoelectric driver that produces acoustic waves which must traverse the ink in the precision acoustic cavity to the nozzles. Each of manufacture will translate to reduced cost. The fabrication of the piezoelectric driver and anechoic terminator are individually of straightforward design and cost effective. The piezoelectric driver assembly especially is much smaller and less costly than that of the typical piezoelectric driven droplet generator having a specific acoustic cavity. In addition, the electrical power required to operate the piezoelectric driver assembly 48 is lower than that for the typical continuous stream droplet generator. The non-resonant design of the traveling wave droplet generator improves acoustic excitation uniformity, droplet break off, phase, and reduces the cost of fabrication.

Many modifications and variations are apparent from the foregoing description of the invention and all such modifications and variations are intended to be within the scope of the present invention.

We claim:

1. A traveling wave droplet generator for a continuous stream ink jet printer comprising:
   - an elongated tube with a linear series of parallel passageways through the tube wall which are perpendicular to the axial length of the tube;
   - a nozzle plate having a plurality of nozzles therein, the nozzle plate being fixedly attached to the tube with its nozzles aligned and coaxial with the passageways of the tube;
   - a piezoelectric driver assembly having a flexible member being mounted on one end of the tube for generating sound waves;
   - an anechoic terminator being positioned within the traveling wave tube and at the end opposite to the end with the piezoelectric driver assembly;
   - a first opening being located near one end of the traveling wave tube in the vicinity of the piezoelectric driver assembly for receiving pressurized ink and a second opening being located near the other end of the traveling wave tube in the vicinity of the anechoic terminator for selectively venting air from the traveling wave tube;
   - means for supplying pressurized ink to the traveling wave tube via the first opening; and means to drive the piezoelectric driver assembly.

2. The traveling wave droplet generator of claim 1, wherein the anechoic terminator is a resilient material having a concial shape with its apex aligned with the longitudinal axis of elongated tube and confronting the piezoelectric driver assembly on the opposite end of the elongated tube.

3. The traveling wave droplet generator of claim 2, wherein the anechoic terminator is wedge-shaped.

4. The traveling wave droplet generator of claim 1, wherein the internal diameter of the elongated tube is about 0.2 inches or 0.5 cm for 144 KHz operation; and wherein the tube passageways has a diameter of between 20 to 40 mils or 0.5 to 1 mm.

5. The traveling wave droplet generator of claim 1, wherein the portion of the elongated tube wall having the passageways therethrough has an external flat surface portion to accommodate attachment of the nozzle plate.

6. The traveling wave droplet generator of claim 5, wherein the nozzle plate is bonded to the elongated tube flat surface portion.

* * * * *